(12) United States Patent
Corisis et al.

(10) Patent No.: US 8,072,055 B2
(45) Date of Patent: *Dec. 6, 2011

(54) HIGH DENSITY STACKED DIE ASSEMBLIES, STRUCTURES INCORPORATED THEREIN AND METHODS OF FABRICATING THE ASSEMBLIES

(75) Inventors: David J. Corisis, Nampa, ID (US); Tongbi Jiang, Boise, ID (US); Shijian Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

This patent is subject to a terminal disclaimer.

(21) Appl. No.: 12/563,862

(22) Filed: Sep. 21, 2009

(65) Prior Publication Data

US 2010/0013074 A1    Jan. 21, 2010

Related U.S. Application Data

(63) Continuation of application No. 11/514,819, filed on Sep. 1, 2006, now Pat. No. 7,592,691.

(51) Int. Cl.
*H01L 23/02* (2006.01)

(52) U.S. Cl. ............... 257/686; 257/777; 257/E25.006; 257/E25.013

(58) Field of Classification Search .............. 257/686, 257/687, 777, 787, E25.006, E25.013
See application file for complete search history.

(56) References Cited

U.S. PATENT DOCUMENTS

| | | |
|---|---|---|
| 5,012,323 A | 4/1991 | Farnworth |
| 5,206,188 A | 4/1993 | Hiroi et al. |
| 5,285,104 A | 2/1994 | Kondo et al. |
| 5,299,097 A | 3/1994 | Kondo et al. |
| 5,495,398 A | 2/1996 | Takiar et al. |
| 6,376,904 B1 | 4/2002 | Haba et al. |
| 6,441,495 B1 | 8/2002 | Oka et al. |
| 6,472,758 B1 | 10/2002 | Glenn et al. |
| 6,514,794 B2 | 2/2003 | Haba et al. |
| 6,621,155 B1 | 9/2003 | Perino et al. |
| 6,843,421 B2 | 1/2005 | Chhor et al. |
| 6,900,528 B2 | 5/2005 | Mess et al. |
| 7,592,691 B2 * | 9/2009 | Corisis et al. ............... 257/686 |
| 2005/0172894 A1 | 8/2005 | Farnworth |
| 2006/0267173 A1 | 11/2006 | Takiar et al. |

* cited by examiner

*Primary Examiner* — Hoai V Pham
(74) *Attorney, Agent, or Firm* — TraskBritt

(57) ABSTRACT

A stacked semiconductor die assembly includes at least two partially offset semiconductor dice with bond pads located adjacent at least one peripheral side thereof supported on a redistribution element formed of a material of substantially similar CTE to that of the dice, and a paddle-less lead frame secured to the redistribution element during fabrication, including encapsulation. The assembly is configured to be substantially vertically symmetrical with respect to inner ends of lead fingers of the lead frame to facilitate uniform encapsulant flow. The semiconductor die assembly may be configured in a package with leads extending from two sides thereof, such as a thin small outline package (TSOP), or four sides thereof, such as a quad flat pack (QFP).

22 Claims, 7 Drawing Sheets

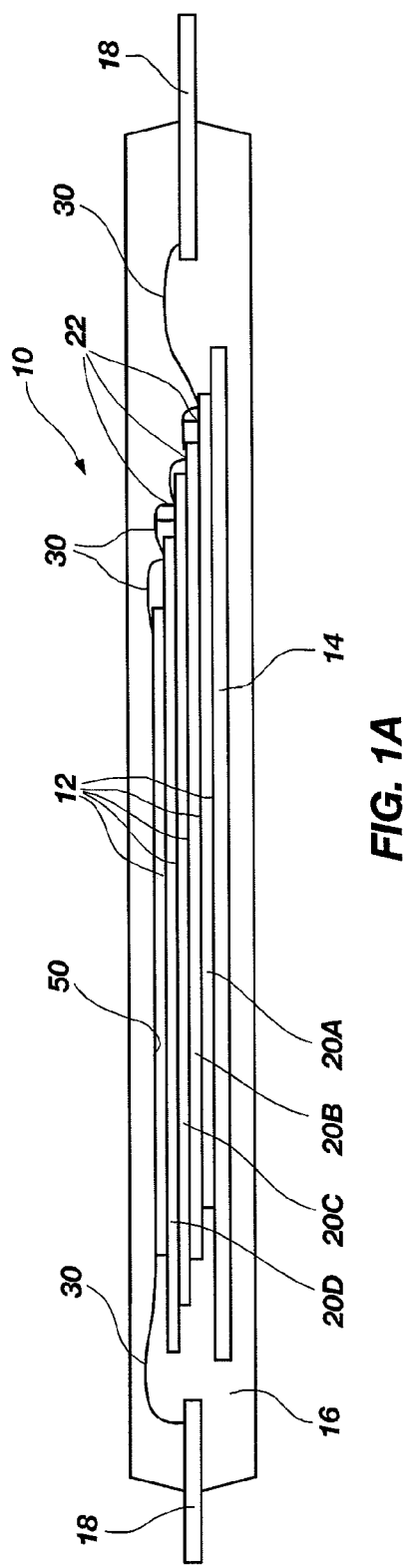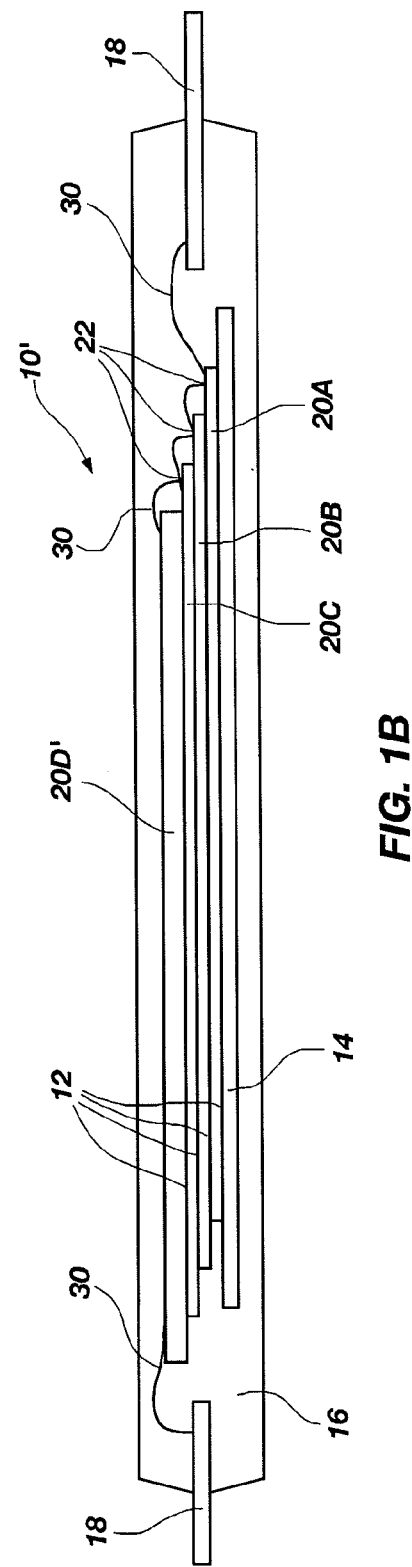

HIGH DENSITY STACKED DIE ASSEMBLIES, STRUCTURES INCORPORATED THEREIN AND METHODS OF FABRICATING THE ASSEMBLIES

CROSS-REFERENCE TO RELATED APPLICATION

This application is a continuation of application Ser. No. 11/514,819, filed Sep. 1, 2006, now U.S. Pat. No. 7,592,691, issued Sep. 22, 2009, the disclosure of which is hereby incorporated herein by this reference in its entirety.

BACKGROUND OF THE INVENTION

1. Field of the Invention

Embodiments of the invention relate generally to semiconductor devices. More particularly, the invention, in various embodiments, pertains to assemblies of stacked semiconductor dice, structures incorporated in such assemblies, methods of fabricating such assemblies and systems including such assemblies.

2. Discussion of Related Art

The use of integrated circuit (IC) chips or dice is widespread in electronics applications. Continuing progress in the manufacture of IC chips has resulted in chips of greatly increased density, i.e., a higher number of semiconductor die per footprint area of each chip. In order to produce increasingly complex electronic structures exhibiting high circuit densities, it has become common practice to stack dice on a lead frame die paddle to create what is known in the art as a multi-chip package or multi-chip module (MCM). One challenge posed by conventional stacked die MCM configurations is that of providing sufficient access to the bond pads of dice below the top die in a stack to enable wire bonding using conventional equipment. Current stacked die configurations for an MCM include a wedding cake, or pyramid, where the die size becomes progressively smaller from the bottom to the top of the stack, alternating large dice with small dice, using substantially the same size dice superimposed one upon another with laterally smaller spacers between the dice to allow access to the bond pads, using dice bonded back-to-back, and mounting one or more dice on opposite sides of a die paddle. Some of these variations of multi-chip packages are described in U.S. Pat. Nos. 6,514,794 and 6,376,904 each to Haba et al., U.S. Pat. No. 6,621,155 to Perino et al., U.S. Pat. No. 5,495,398 to Takiar et al. and U.S. Pat. No. 6,900,528 to Mess et al.

A shingle stack is an MCM configuration where a plurality of dice is stacked on a die paddle and wherein each die is partially offset from the next lower die in the stack in order to expose the bond pads of the next lower die. However, when the desired MCM configuration includes leads on opposite sides, such as in a thin small outline package (TSOP) or small outline J-lead package (SOJ) configuration and the semiconductor bond pads are only formed along a single side of the active surface of each die, a redistribution layer either formed on the active surface of the uppermost die or applied as a separate structure thereto is required to electrically communicate with the leads on the opposite sides of the package opposite the location of the semiconductor die bond pads.

While the die paddle provides alignment and support of the semiconductor die stack during assembly, the die paddle requires a significant amount of space or "real estate" and also adds significantly to the overall height of the die stack. Further, when such a semiconductor die assembly is in operation, temperature change can create significant thermal stress between the die paddle and the adjacent semiconductor die due to the significantly greater coefficient of thermal expansion (CTE) of the metal die paddle relative to the silicon material of the semiconductor dice, physically cracking the transfer-molded package structure encapsulating the stacked die assembly, compromising package integrity and potentially leading to device failure.

FIG. 1A depicts one embodiment of a known, although not prior art, semiconductor die assembly 10 in a shingle stack configuration wherein semiconductor dice 20A, 20B, 20C and 20D are mutually adhesively secured with segments of die attach film 12 and the lowermost die 20A to the die paddle 14 of a lead frame, with each successive die 20B to 20D partially offset from that immediately below it in order to expose the bond pads 22 of the underlying dice. It should be noted that die attach film 12 is depicted in FIGS. 1A and 1B as merely the boundary between adjacent components due to the relatively thin nature thereof, for the sake of convenience. A redistribution element in the form of silicon interposer 50 bearing conductive traces is adhesively secured with another segment of die attach film 12 to the active surface of die 20D. Bond wires 30 are used for electrical communication as required between the dice 20A, 20B, 20C, 20D, the conductive traces of silicon interposer 50 and the conductive lead fingers 18 on both sides of the die stack for the semiconductor die assembly 10. The components of semiconductor die assembly 10 are sealed with an encapsulant structure 16, with only the outer ends of conductive lead fingers 18 exposed beyond encapsulant structure 16 to allow electrical connection of the semiconductor die assembly 10 with higher level packaging, such as a printed circuit board or other carrier structure.

In the embodiment of FIG. 1A, the lead frame die paddle 14 is of 127 μm thickness, semiconductor dice 20A through 20D are each of 90 μm thickness, silicon interposer 50 is of 100 μm thickness, and the segments of die attach film 12 are each of 10 μm thickness. Of course, the portions of encapsulant structure 16 above and below the die stack adds significantly to the package height.

FIG. 1B depicts another embodiment of a known, but not prior art, semiconductor die assembly 10' in a shingle stack configuration wherein semiconductor dice 20A, 20B, 20C and 20D' are mutually adhesively secured with segments of die attach film 12 and the lowermost die 20A to the die paddle 14, with each successive die 20B to 20D' partially offset from that immediately below it in order to expose the bond pads 22 of the underlying dice. Unlike the embodiment of FIG. 1A, no separate redistribution element is employed; rather, uppermost semiconductor die 20D' is provided with a redistribution layer comprising conductive traces extending over the active surface thereof. Bond wires 30 are used for electrical communication as required between the dice 20A, 20B, 20C, 20D', the conductive traces of the redistribution layer of uppermost semiconductor die 20D', and the conductive lead fingers 18 on both sides of the die stack for the semiconductor die assembly 10'. The components of semiconductor die assembly 10' are sealed with an encapsulant structure 16 with the outer ends of conductive lead fingers 18 exposed beyond encapsulant structure 16 to allow electrical connection of the semiconductor die assembly 10' with higher level packaging such as a printed circuit board or other carrier structure.

In the embodiment of FIG. 1B, the lead frame die paddle 14 is of 130 μm thickness, semiconductor dice 20A through 20C are each of 100 μm thickness, semiconductor die 20D', including a redistribution layer, is of 150 μm thickness, and the segments of die attach film 12 are each of 10 μm thickness.

Again, encapsulant structure 16 above and below the die stack adds significantly to the package height.

Stacked, multi-die packages have become ever-thinner in response to demands of the industry based on increased usage of the packages in portable electronic devices and, in particular, the demand for increased memory capacity despite the continuing decrease in the size of such devices. Thus, use of separate redistribution elements such as interposers or a top die with a redistribution layer thereon in combination with a lead frame paddle presents significant obstacles to stacking more semiconductor dice in a package due to minimum die thickness requirements for adequate yield. For example, the specification thickness for a TSOP package envelope is 1 mm (1.2 mm with lead finger standoff), requiring unacceptably thin, extremely fragile dice on the order of 80 μm thick if a lead frame paddle is employed.

BRIEF DESCRIPTION OF THE DRAWINGS

FIGS. 1A and 1B respectively illustrate conventional MCM structures employing a shingle stack configuration of semiconductor dice;

FIGS. 2A through 2D illustrate a first embodiment of a shingle stack-configured semiconductor die assembly according to the present invention, wherein FIG. 2A is a top elevation of the assembly with all but the lowermost die removed for clarity, FIG. 2B is a top elevation of the assembly with the entire die stack shown; FIG. 2C is a side sectional elevation of the assembly, and FIG. 2D is a top elevation of the two assemblies prior to severance from a lead frame strip bearing the lead frames thereof;

DETAILED DESCRIPTION OF THE ILLUSTRATED EMBODIMENTS

Figure 2A:
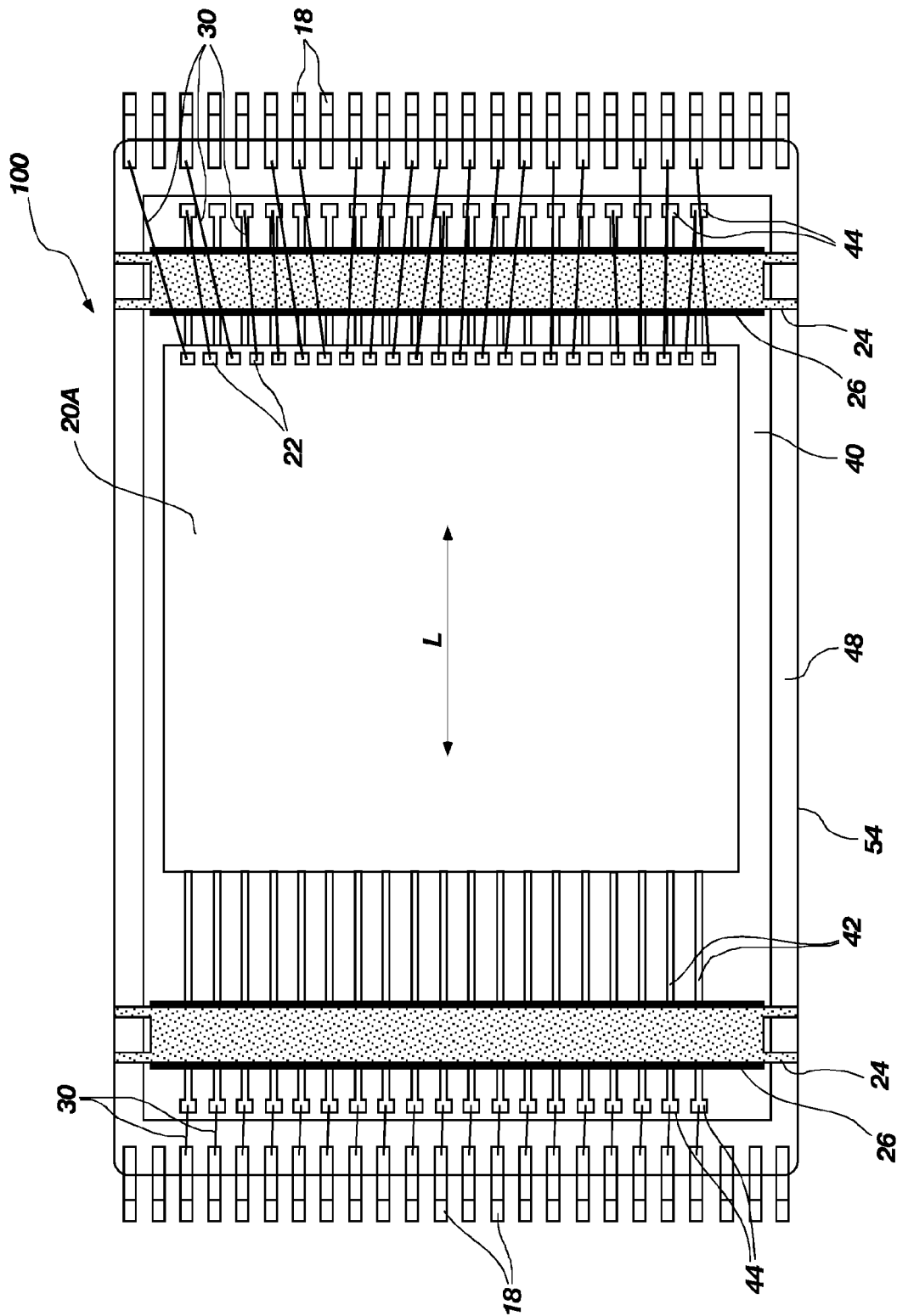

In the description which follows, like features and elements have been identified by the same or similar reference numerals for ease of identification and enhanced understanding of the disclosure hereof. Such identification is by way of convenience for the reader only, however, and is not limiting of the scope of the present invention or an implication that features and elements of various components and embodiments identified by like reference numerals are identical or constrained to identical functions.

In accordance with one embodiment of the invention, a stacked multi-die assembly is formed using at least two semiconductor dice with bond pads located on one side or two adjacent sides of the individual semiconductor die, a redistribution element on which the dice are stacked comprising a substrate of semiconductor material or other material exhibiting a coefficient of thermal expansion (CTE) similar to that of the semiconductor dice, and a paddle-less lead frame having a plurality of lead fingers disposed along at least two sides of the redistribution element. The assembly of the invention is particularly useful when using semiconductor dice that are identical, or substantially the same in shape, size and bond pad configuration, although the invention is not so limited. The semiconductor die may have a single row of bond pads adjacent a peripheral edge, multiple rows with mutually staggered bond pads, or multiple rows of aligned bond pads.

The semiconductor dice are arranged in a stack in which each individual semiconductor die is laterally offset in at least one direction (e.g., length or width) from at least one adjacent semiconductor dice, the offset providing access to the bond pads of each adjacent semiconductor die for subsequent wire bonding operations. In one embodiment, the bond pads of the semiconductor dice are located in one or more rows proximate one peripheral edge of their active surfaces and each higher semiconductor die in the stack is simply shifted laterally along either an X- or Y-axis in a plane parallel to the immediately lower semiconductor die to allow access to the bond pads of the underlying die. In another embodiment, the bond pads of the semiconductor dice are located in one or more rows along two adjacent edges of each die to form an "L" pattern, and each overlying die is shifted on a diagonal, or along both X- and Y-axes, until sufficient clearance is available to the rows of bond pads of the underlying die to enable wire bonding.

Another embodiment of the invention includes providing a redistribution element comprising a substrate of semiconductor material or material of similar CTE to which the stack of semiconductor dice are secured. The redistribution element includes a first plurality of terminal pads disposed along at least one peripheral edge thereof proximate bond pads of the semiconductor dice and a second plurality of terminal pads disposed along at least one other peripheral edge thereof remote from the semiconductor dice bond pads. Bond pads of the semiconductor dice are connected to terminal pads of the first plurality as well as to selected lead fingers adjacent to the bond pads. Conductive traces formed on or in the redistribution element provide electrical communication between terminal pads of the first plurality to which bond pads of the semiconductor dice are connected, and terminal pads of the second plurality, which are connected to lead fingers adjacent thereto.

Yet another embodiment of the invention includes use of a paddle-less lead frame employed in combination with a redistribution element placed under the bottom of the die stack. Eliminating the use of a die paddle provides several design advantages, as the thickness, or height, of the overall semiconductor device assembly can be reduced by an amount corresponding to the thickness of the die paddle. Further, the thickness of the individual semiconductor dice used in the stacked assembly can be increased while still providing a finished semiconductor device assembly of less than the, or the same, thickness as a functionally equivalent assembly formed using a die paddle. Thicker dice provide overall higher batch yields during manufacturing, are easier to handle, and are both structurally and electrically less fragile. In addition, if die thickness is not greatly increased, one or more semiconductor dice may be added to the die stack in the package in comparison to paddle-type lead frame based packages without compromising mechanical and electrical integrity of the dice.

Further, use of a redistribution element substrate comprising a semiconductor material or a material of similar CTE provides a coefficient of thermal expansion, or CTE, close, if not identical to, that of the semiconductor material of the semiconductor dice, avoiding the severe mismatch of CTEs, which occurs when a metal leadframe paddle is employed, and associated stress on the assembly during thermal cycling experienced in normal operation of the semiconductor device assembly.

Another advantageous aspect of an embodiment of the semiconductor device of the present invention is a lead frame having a plurality of tie bars extending thereacross from one side to an opposing side, the redistribution element being secured to the undersides of the tie bars in alignment with lead fingers of the lead frame on at least two sides thereof in a die mounting location defined by an aperture in the lead frame support structure. The tie bars may be downset, relative to the lead fingers, to provide vertical package symmetry about the centerline, which configuration facilitates substantially equal flow of molding compound above and below the die stack during encapsulation to minimize any potential for shifting of the die stack, eliminates internal package stress and the potential for warping due to the presence of uneven volumes of the encapsulant about the centerline, and enables the use of dam bars laterally extending between the lead fingers proximate the midpoint of vertical package height as part of the seal between the mold plates defining the mold cavity for encapsulation.

The features, advantages, and aspects of embodiments of the present invention will be apparent to those skilled in the art from a consideration of the following detailed description taken in combination with the accompanying drawings.

Figure 2B:
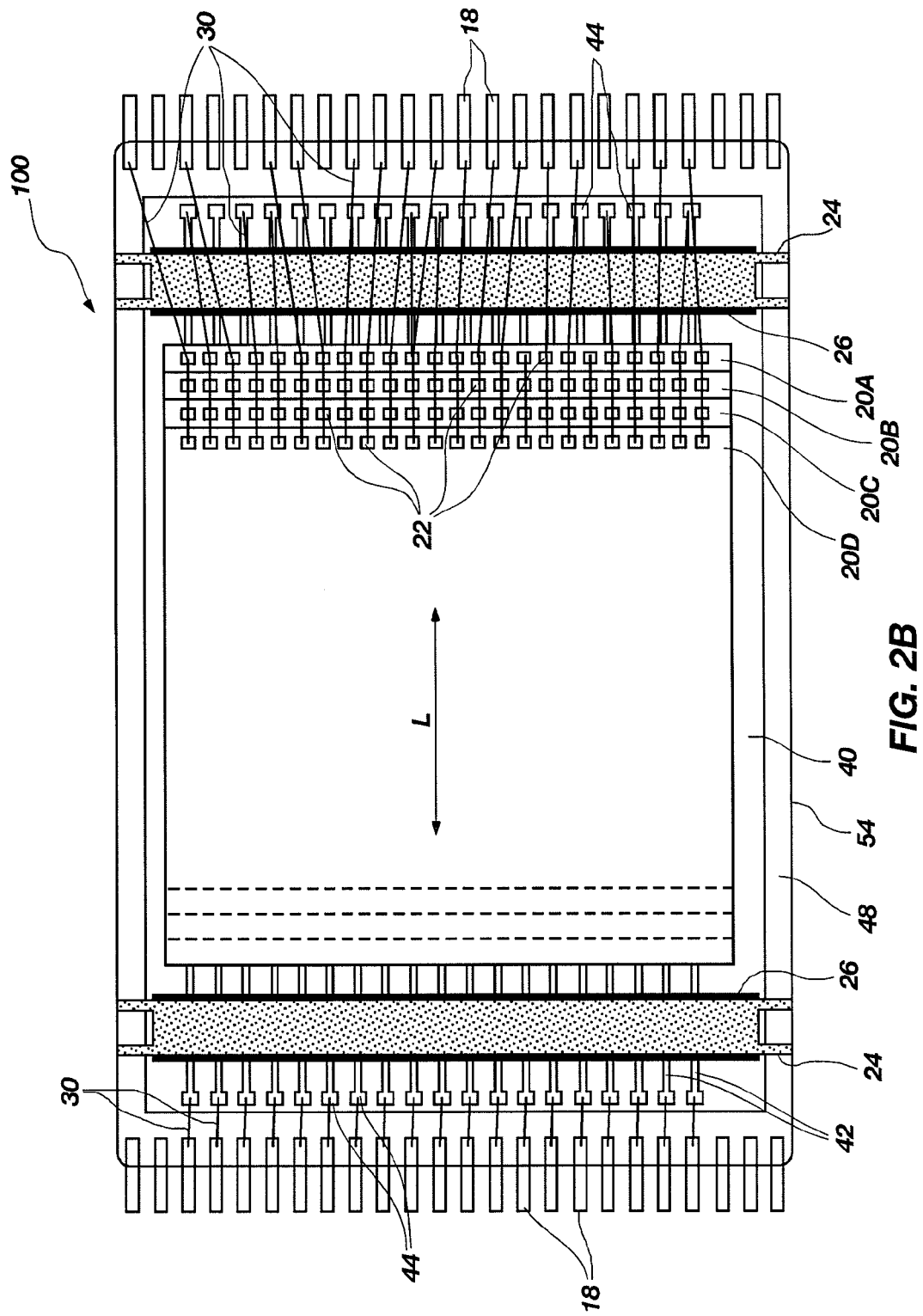
Figure 2C:
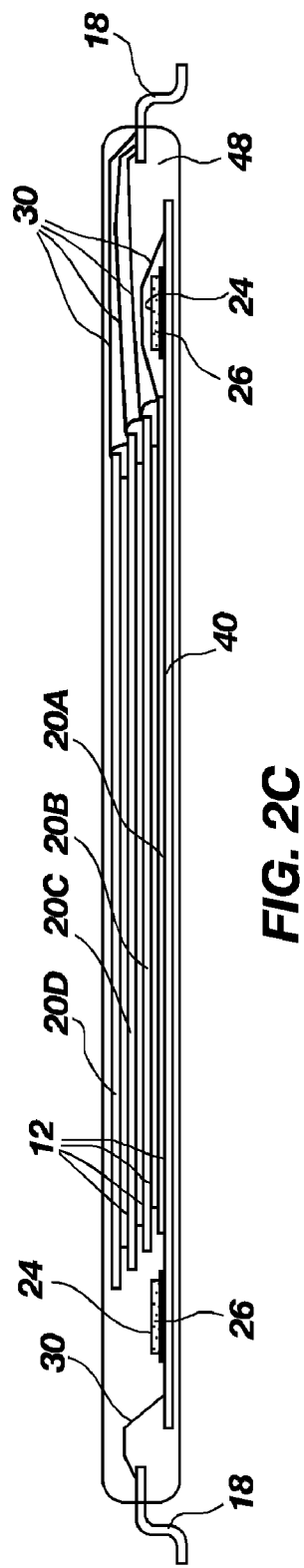

FIGS. 2A through 2D depict a first embodiment of a semiconductor die assembly 100 of the present invention configured by way of nonlimiting example as a Type I TSOP (Thin Small Outline Package), wherein gull wing leads extend from opposing short (width) sides of the package. In semiconductor die assembly 100, semiconductor dice 20A, 20B, 20C and 20D are disposed in a shingle stack configuration, mutually offset in one direction along the lengths L of the semiconductor dice. Semiconductor dice 20A through 20D may comprise any semiconductor dice of the same or similar size and shape and having one or more rows of bond pads 22 adjacent a single peripheral edge of the active surface. In the embodiment, semiconductor dice 20A through 20D comprise memory dice, such as Flash memory dice and, more specifically, NAND Flash memory dice. Semiconductor dice 20A through 20D are mutually adhesively secured and the lowermost die 20A adhesively secured by its back side to a redistribution element 40 using a die attach material 12. FIG. 2C best shows die attach material 12 between dice 20A, 20B, 20C and 20D, of greatly exaggerated thickness, for clarity. Die attach material 12 may comprise segments of an adhesive material such as a die attach paste, or may comprise dielectric tape or film segments, such as a die attach film formed of a polymer (for example, a KAPTON® polyimide film) having an adhesive on both sides thereof. While segments of die attach material 12 are shown in FIG. 2C as being of smaller lateral dimensions than semiconductor dice 20A through 20D, they may be of the same exact size, or even larger than semiconductor dice 20A through 20D. Further, all segments of die attach material 12 need not be of the same size in a given assembly. The redistribution element 40 includes conductive traces 42 respectively extending between a first plurality of terminal pads 44 proximate the row or rows of the bond pads 22 of lowermost semiconductor die 20A (FIG. 2A) and a second plurality of terminal pads 44 on the opposite side of the redistribution element 40. The substrate of the redistribution element 40 may comprise, for example, silicon.

Figure 2D:
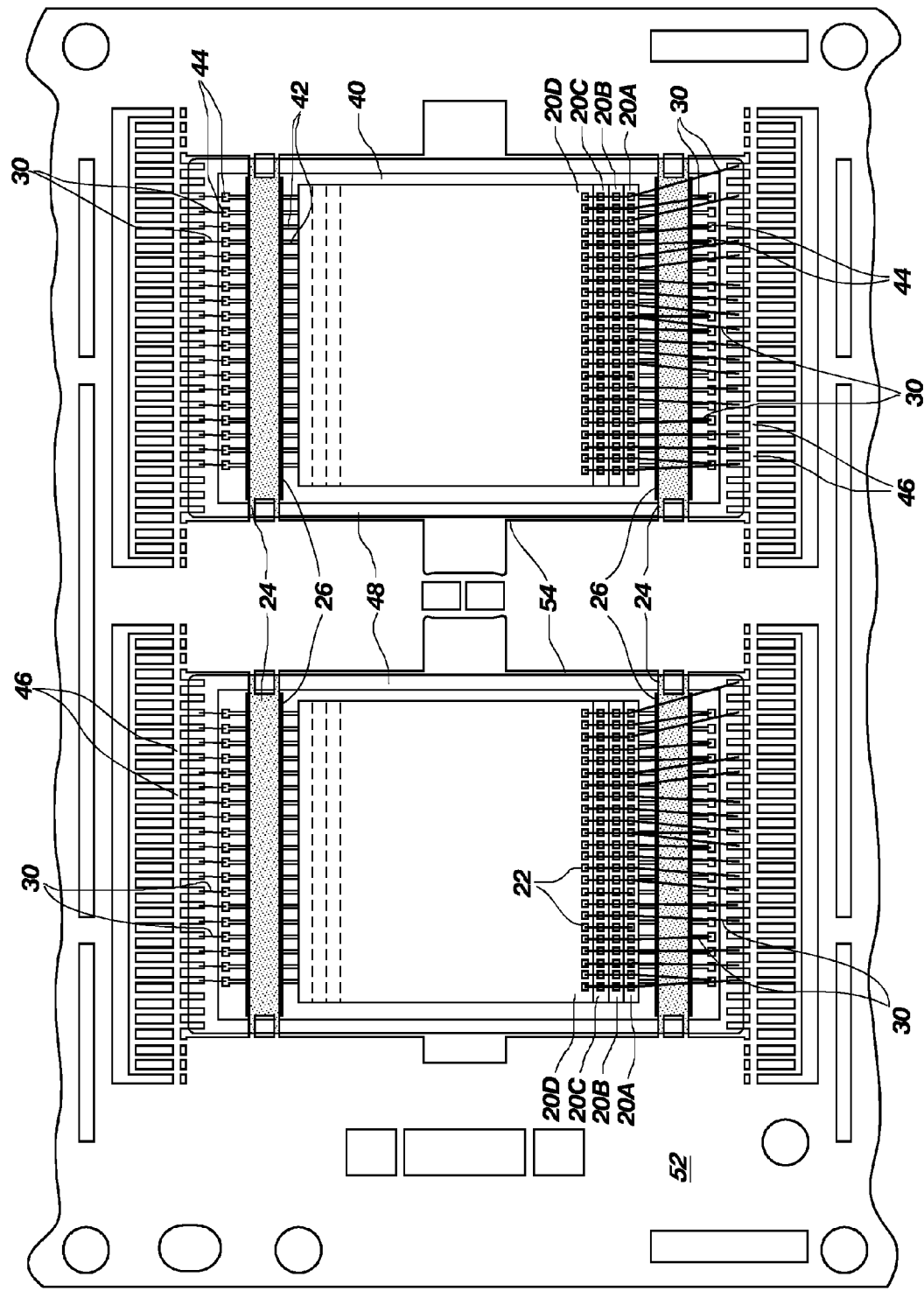

The semiconductor dice 20A to 20D may be mutually electrically connected via bond wires 30 at their respective bond pads, the bond wires 30 may be extended directly from semiconductor die bond pads 22 of semiconductor dice 20A to 20D to terminal pads 44 of the first plurality or directly to conductive lead fingers 18 of a first plurality adjacent to bond pads 22, as well as to terminal pads 44 of the first plurality, or each of the foregoing in selected instances, as the circuit design requires. Conductive lead fingers 18 of a second plurality adjacent the opposing side of redistribution element 40 may be electrically connected to the terminal pads 44 of the second plurality with bond wires 30. Two longitudinally spaced tie bars 24, as best shown in FIG. 2A, are in a finished condition following electrical isolation from the surrounding lead frame strip (see FIG. 2D) effected using a conventional trim and form operation, which also removes dam bars 46 (see FIG. 2D) from between laterally adjacent conductive lead fingers 18. During the assembly process prior to the trim and form operation, and as shown in FIG. 2D, the tie bars 24 extend beyond the ultimate peripheral boundary 54 of the encapsulant structure 48 to a surrounding and supporting lead frame structure 52, which also carries the conductive lead fingers 18 (FIG. 2B) extending inwardly therefrom and maintained in precise alignment by dam bars 46. This lead frame structure 52 is secured by tie bars 24 to the upper surface of redistribution element 40 using, for example leads-on-chip (LOC) tape 26, comprising a dielectric film having an adhesive on both sides thereof. The finished semiconductor die assembly 100 is encapsulated to form encapsulant structure 48 using a dielectric encapsulant, typically a silicon particle-filled thermoplastic resin in a transfer molding operation. As mentioned previously, tie bars 24 may be downset relative to the inner ends of conductive lead fingers 18, as shown in FIG. 2B, to place the dam bars 46 at the vertical center of the semiconductor die assembly 100 and to place the stack of semiconductor dice 20A through 20D mounted to redistribution element 40 in a vertically symmetrical relationship with respect to the ultimate encapsulant structure 48 to facilitate substantially uniform flow of the encapsulant in a liquid form over, under and around the sides of semiconductor dice 20A to 20D and the underlying redistribution element 40.

Of course, encapsulation may be effected using other techniques, such as injection molding and pot molding. Further, in lieu of using wire bonds for electrical connections, a TAB (tape automated bonding) connection using conductive traces carried on a flexible dielectric film, may be used.

While the foregoing embodiment is configured as a Type I TSOP, the present invention also encompasses other small outline package configurations such as, for example, a Type II TSOP wherein the lead fingers extend along opposing long (length) sides of the package.

Figure 3:
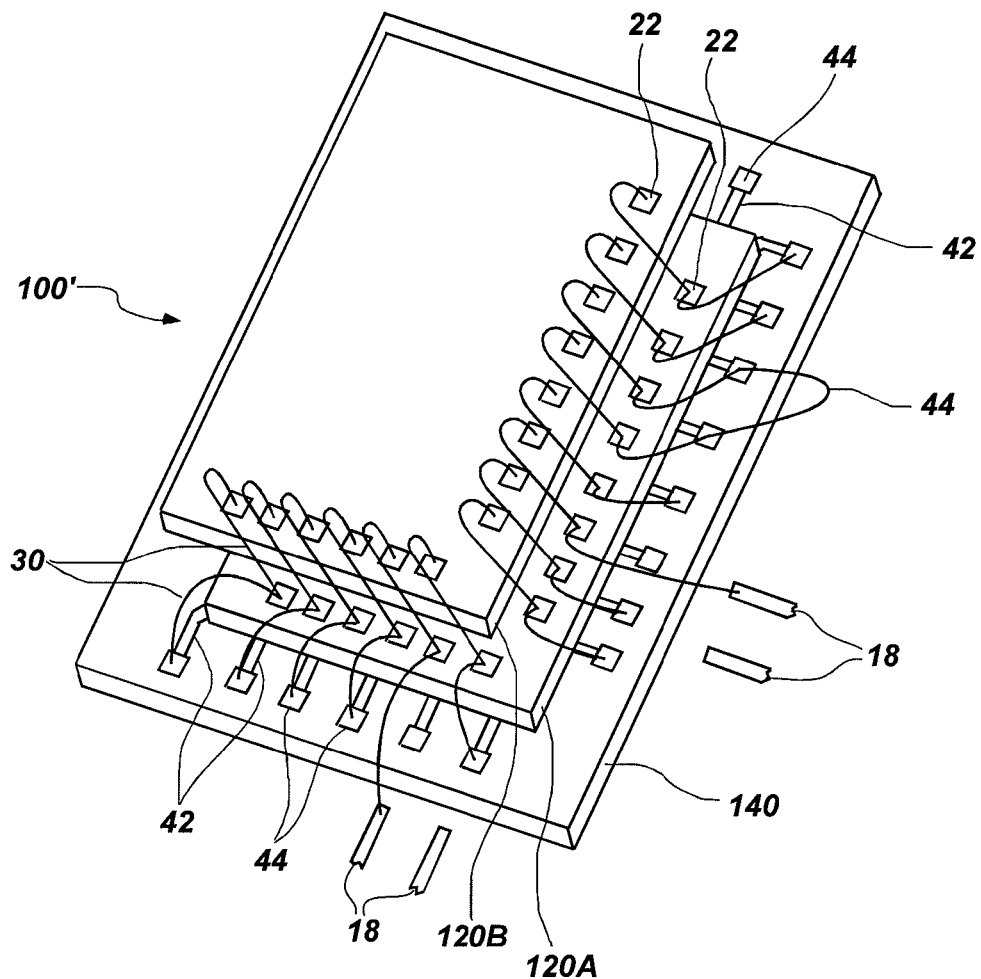
FIG. 3 is a partial perspective view of another embodiment of a shingle stack-configured semiconductor die assembly according to the present invention, wherein dice are shifted diagonally relative to an underlying die in order to expose bond pads of two adjacent edges.

FIG. 3 depicts an embodiment of a semiconductor dice assembly 100', according to the present invention, wherein a semiconductor die 120B is offset in two directions (lengthwise and widthwise), or diagonally, in order to expose bond pads 22 disposed in an "L" shaped pattern proximate two adjacent peripheral edges of underlying semiconductor die 120A and semiconductor die 120A is, in turn, diagonally offset from underlying redistribution element 140 to expose a first plurality of terminal pads 44 disposed in an "L" shaped pattern proximate two adjacent, peripheral edges thereof. Of course, more than two semiconductor dice may be stacked, as in the previously described embodiment. The terminal pads 44 of the first plurality electrically communicate with terminal pads 44 of a second plurality adjacent at least one other peripheral edge of redistribution element 140 via conductive traces 42 carried on or within redistribution element 140. Bond wires 30 may be used to electrically connect bond pads 22 of semiconductor dice 120A and 120B, conductive lead fingers 18 of the lead frame (only a few shown for clarity) with bond pads 22 of semiconductor dice 120A and 120B, and bond pads 22 of semiconductor dice 120A and 120B with terminal pads 44 of the first plurality, as dictated by the circuit design.

Figure 4:
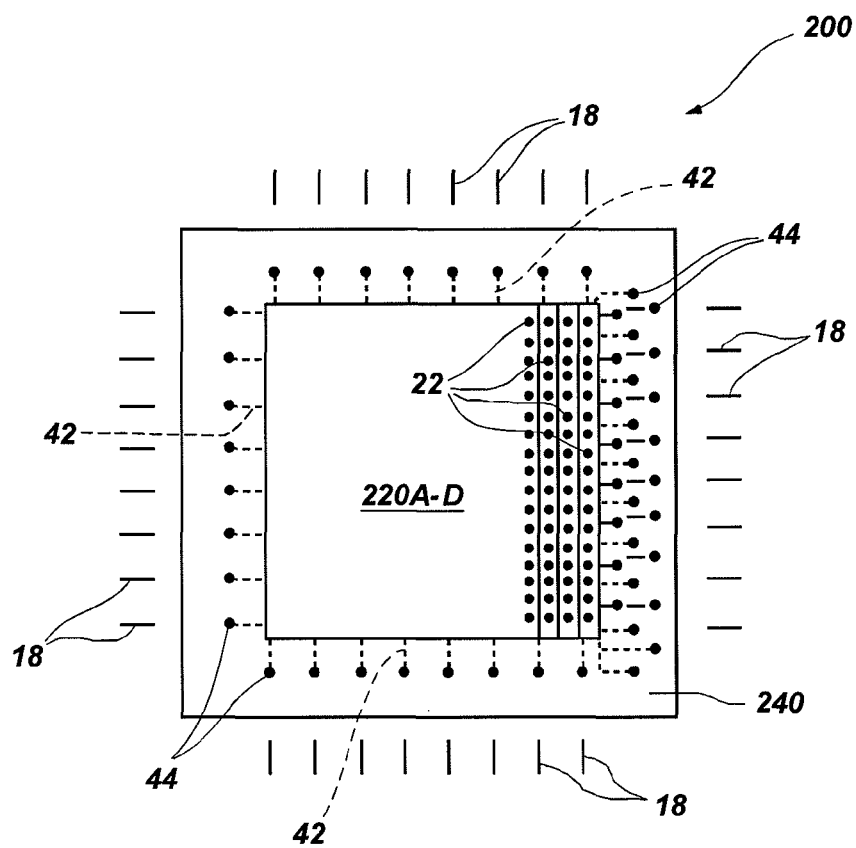
FIG. 4 is a schematic top elevation illustrating an embodiment of a base redistribution element suitable for use in implementation according to the present invention and configured for fabrication of a quad flat pack semiconductor die assembly.

As will be appreciated from both of the embodiments previously described herein, a redistribution element according to the present invention may be configured to form a thin small outline package (TSOP) or other package configuration having lead fingers extending from opposing sides thereof. Further, as schematically depicted in FIG. 4 of the drawings, a semiconductor die assembly 200, according to an embodiment of the present invention, may comprise a redistribution element 240 configured with terminal pads 44 along all four peripheral edges thereof with, for example, conductive traces 42 leading from a first plurality of terminal pads 44 extending adjacent one peripheral edge of redistribution element 240 to terminal pads 44 extending adjacent a second, third and fourth peripheral edge of redistribution element 240 in a configuration suitable for a quad flat pack (QFP) package structure. As shown in broken lines, conductive traces 42 may traverse redistribution element 240 on multiple planes or levels, to facilitate connection of stacked dice 220A through 220D (by way of example only) with conductive lead fingers 18 on all four peripheral edges of redistribution element 240 using bond wires (not shown, for clarity) extending from bond pads 22 of the stacked semiconductor dice 220A through 220D to terminal pads 44 as well as to adjacent conductive lead fingers 18. It should be noted that terminal pads 44 adjacent to one side of redistribution element 240 may lie in multiple, staggered rows to facilitate wire bonding thereto and to provide sufficient terminal pads 44 adjacent the rows of bond pads 22 of stacked semiconductor dice 220A through 220D. Of course, the redistribution element 240 may also be configured, in a manner similar to that described herein with respect to FIG. 3, with conductive traces extending from terminal pads extending adjacent adjoining first and second peripheral edges of the substrate thereof to terminal pads extending adjacent adjoining third and fourth peripheral edges thereof.

Figure 5:
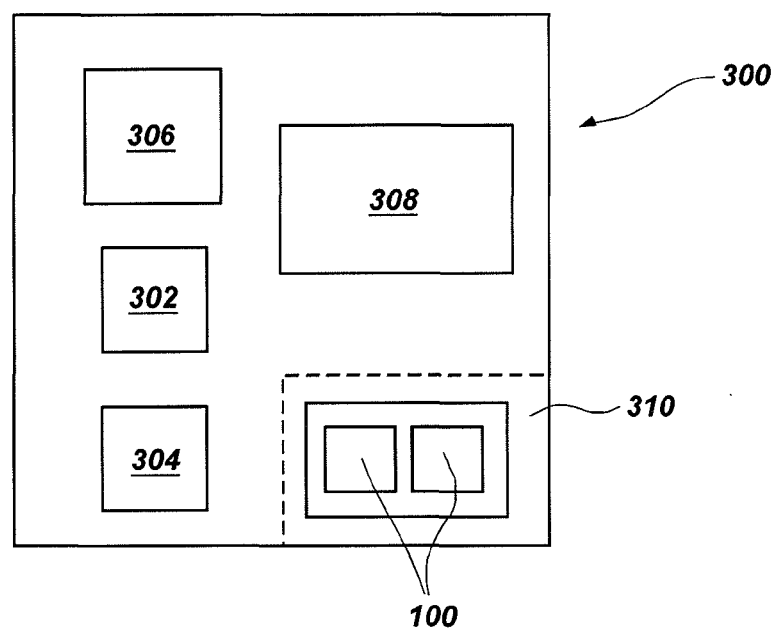
FIG. 5 is a schematic block diagram of an embodiment of a system incorporating a semiconductor die assembly according to the present invention.

FIG. 5 schematically depicts a system 300 including an input device 302, an output device 304, a processor 306, an optional display 308 and at least one semiconductor die assembly 100 in accordance with the present invention. The processor 306 may, optionally, be incorporated in the at least one semiconductor die assembly. The at least one semiconductor die assembly may comprise a memory device 310 configured according to an embodiment of the present invention including a plurality of memory (such as Flash memory) dice in one or more assemblies 100 (by way of example only). As shown in broken lines, memory device 310 may be removable from system 300 and comprise, for example, a memory card or stick or a USB drive. System 300 may comprise, by way of nonlimiting examples: a personal computer; a cell phone, a personal digital assistant (PDA) or other wireless device; a digital camera; an MP3 device; an iPOD®-type device; a display, a set top box, a gaming device, a vehicle or other article, apparatus or structure incorporating semiconductor dice in a digital circuit.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from, or limiting, the scope of the invention as characterized by the claims that follow.

What is claimed is:
1. A semiconductor die assembly comprising:
a redistribution element including conductive traces extending between terminal pads of a first plurality of terminal pads adjacent to one peripheral edge of the redistribution element and terminal pads of a second plurality of terminal pads adjacent to a second peripheral edge of the redistribution element;
a plurality of semiconductor dice each having a plurality of bond pads disposed along one peripheral edge thereof, one semiconductor die of the plurality of semiconductor dice being disposed adjacent to the redistribution element with the bond pads of the one semiconductor die being located adjacent to the first plurality of terminal pads and each other semiconductor die of the plurality of semiconductor dice being disposed adjacent to the redistribution element or another semiconductor die of the plurality of semiconductor dice and partially offset therefrom sufficiently to leave the bond pads of each semiconductor die exposed; and
leads comprising a first plurality of lead fingers adjacent to the first plurality of terminal pads of the redistribution element and a second plurality of lead fingers adjacent to the second plurality of terminal pads of the redistribution element.
2. The semiconductor die assembly of claim 1, further comprising:
a conductive element connecting at least one bond pad of the one semiconductor die with a terminal pad of the first plurality.
3. The semiconductor die assembly of claim 1, further comprising:
a conductive element connecting at least one bond pad of the one semiconductor die with a lead finger of the first plurality.
4. The semiconductor die assembly of claim 1, further comprising:
a conductive element connecting at least one bond pad of the one semiconductor die with a bond pad of at least one other semiconductor die of the plurality of semiconductor dice.
5. The semiconductor die assembly of claim 1, further comprising:
a conductive element connecting at least one bond pad of at least one other semiconductor die of the plurality of semiconductor dice with a lead finger of the first plurality.
6. The semiconductor die assembly of claim 1, further comprising:
a conductive element connecting at least one terminal pad of the second plurality of terminal pads with a lead finger of the second plurality of lead fingers.
7. The semiconductor die assembly of claim 1, wherein the plurality of semiconductor dice is four semiconductor dice.
8. The semiconductor die assembly of claim 1, further comprising a dielectric encapsulant structure surrounding the plurality of semiconductor dice, the redistribution element, the conductive elements and inner ends of the lead fingers of the first and second pluralities of lead fingers.
9. The semiconductor die assembly of claim 8, wherein portions of the lead fingers of the first and second pluralities of lead fingers are substantially vertically centered within the dielectric encapsulant structure.
10. The semiconductor die assembly of claim 8, wherein the lead frame structure further comprises a first tie bar and a second tie bar extending across and secured to an upper surface of the redistribution element on opposing sides of the one semiconductor die and the first and second tie bars are downset in relation to the inner ends of the lead fingers of the first and second pluralities of lead fingers.

11. The semiconductor die assembly of claim 1, wherein:
the redistribution element further comprises a third plurality of terminal pads adjacent to a third peripheral edge of the redistribution element, a fourth plurality of terminal pads adjacent to a fourth peripheral edge of the redistribution element and conductive traces extending between terminal pads of the first plurality of terminal pads and terminal pads of the third and fourth pluralities of terminal pads; and
the lead frame structure further comprises a third plurality of lead fingers adjacent to the third plurality of terminal pads and a fourth plurality of lead fingers adjacent to the fourth plurality of terminal pads.

12. The semiconductor die assembly of claim 11, further comprising:
a conductive element connecting at least one terminal pad of the third plurality of terminal pads with a lead finger of the third plurality of lead fingers and a conductive element connecting at least one terminal pad of the fourth plurality with a lead finger of the fourth plurality.

13. The semiconductor die assembly of claim 11, wherein the plurality of semiconductor dice is four semiconductor dice.

14. A semiconductor die assembly, comprising:
an assembly including:
a redistribution element; and
a plurality of semiconductor dice of substantially the same lateral dimensions stacked on the redistribution element in mutually offset relation to one another and to the redistribution element and electrically coupled to the redistribution element; and
lead fingers extending laterally outward from the plurality of semiconductor dice, with portions of the lead fingers located laterally adjacent to the assembly at about a midpoint of a height of the assembly.

15. The semiconductor die assembly of claim 14, further comprising:
an encapsulant structure surrounding the assembly and encapsulating the inner ends of the lead fingers.

16. The semiconductor die assembly of claim 14, wherein each semiconductor die of the plurality of semiconductor dice is located directly adjacent to at least one other semiconductor die of the plurality of semiconductor dice.

17. The semiconductor die assembly of claim 16, wherein a stacked assembly including the plurality of semiconductor dice is secured to an upper surface of the redistribution element.

18. A semiconductor die package, comprising an assembly including a redistribution element and a plurality of semiconductor dice mounted to one another in a mutually offset, stacked relation, tie bars extending across an upper surface of the redistribution element on opposite sides of the assembly, and lead fingers adjacent at least two peripheral edges of the redistribution element.

19. The semiconductor die package of claim 18, wherein each semiconductor die of the plurality of semiconductor dice is located directly adjacent to at least one other semiconductor die of the plurality of semiconductor dice.

20. The semiconductor die package of claim 19, wherein a stacked assembly including the plurality of semiconductor dice is secured to an upper surface of the redistribution element.

21. An electronic system, comprising:
an input device;
an output device;
a processor; and
at least one memory device, comprising:
an assembly including:
a redistribution element; and
a plurality of semiconductor dice of substantially the same lateral dimensions secured to the redistribution element in a stack, the semiconductor dice being in mutually offset relation to one another and to the redistribution element and the semiconductor dice being electrically coupled to the redistribution element; and
lead fingers extending laterally outward from the plurality of semiconductor dice, with portions of the lead fingers located laterally adjacent to the assembly at about a midpoint of a height of the assembly.

22. An electronic system, comprising:
an input device;
an output device;
a processor; and
at least one memory device, comprising an assembly including a redistribution element and a plurality of semiconductor dice mounted to one another in a mutually laterally offset, stacked relation, tie bars extending across an upper surface of a substrate of the redistribution element on opposite sides of the assembly, and lead fingers adjacent at least two peripheral edges of the redistribution element.

* * * * *